United States Patent
Chang et al.

(10) Patent No.: US 9,847,330 B2
(45) Date of Patent: Dec. 19, 2017

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Che-Cheng Chang, New Taipei (TW); Chih-Han Lin, Hsinchu (TW); Horng-Huei Tseng, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 15/071,207

(22) Filed: Mar. 16, 2016

(65) Prior Publication Data
US 2017/0229451 A1   Aug. 10, 2017

Related U.S. Application Data
(60) Provisional application No. 62/291,527, filed on Feb. 5, 2016.

(51) Int. Cl.

| | |
|---|---|
| H01L 29/78 | (2006.01) |
| H01L 29/66 | (2006.01) |
| H01L 27/088 | (2006.01) |
| H01L 29/06 | (2006.01) |
| H01L 21/8234 | (2006.01) |
| H01L 21/762 | (2006.01) |
| H01L 21/02 | (2006.01) |

(52) U.S. Cl.
CPC ...... *H01L 27/0886* (2013.01); *H01L 21/0228* (2013.01); *H01L 21/76224* (2013.01); *H01L 21/823431* (2013.01); *H01L 21/823481* (2013.01); *H01L 29/0649* (2013.01); *H01L 29/66545* (2013.01)

(58) Field of Classification Search
CPC ............ H01L 27/0886; H01L 29/0649; H01L 29/0886; H01L 29/06; H01L 29/08; H01L 29/66; H01L 29/66545; H01L 29/16; H01L 29/24; H01L 29/76; H01L 29/7851; H01L 29/7834; H01L 29/088; H01L 29/161
USPC ....................................................... 257/401
See application file for complete search history.

(56) References Cited

U.S. PATENT DOCUMENTS

2016/0149040 A1* 5/2016 Lee ................. H01L 29/66545
                                                          257/408

* cited by examiner

*Primary Examiner* — Chuong A Luu
(74) *Attorney, Agent, or Firm* — JCIPRNET (57) ABSTRACT

Fin field effect transistors (FinFETs) and method for fabricating the same are disclosed. One of the FinFETs includes a substrate, an insulator, first and second gates, an opening, first and second dielectric layers. The substrate includes first and second semiconductor fins and a trench therebetween. The insulator is disposed in the trench. The first and second gates are respectively disposed on the first and second semiconductor fins. The opening is disposed between the first gate and the second gate. The first dielectric layer is disposed in the opening to electrically insulate the first and second gates and includes a slit. The second dielectric layer is filled in the slit, wherein the opening has a first width in a direction along which the first and second gates extend, the slit has a second width in the direction, and a ratio of the first width to the second width is larger than 2.

13 Claims, 13 Drawing Sheets

FIN FIELD EFFECT TRANSISTOR AND METHOD FOR FABRICATING THE SAME

CROSS-REFERENCE TO RELATED APPLICATION

This application claims the priority benefits of U.S. provisional application Ser. No. 62/291,527, filed on Feb. 5, 2016. The entirety of the above-mentioned patent application is hereby incorporated by reference herein and made a part of this specification.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The embodiments of the present disclosure describe the exemplary fabricating process of FinFETs. The FinFETs may be formed on bulk silicon substrates in certain embodiments of the present disclosure. Still, the FinFET may be formed on a silicon-on-insulator (SOI) substrate or a germanium-on-insulator (GOI) substrate as alternatives. Also, in accordance with the embodiments, the silicon substrate may include other conductive layers or other semiconductor elements, such as transistors, diodes or the like. The embodiments are not limited in this context.

Figure 1:
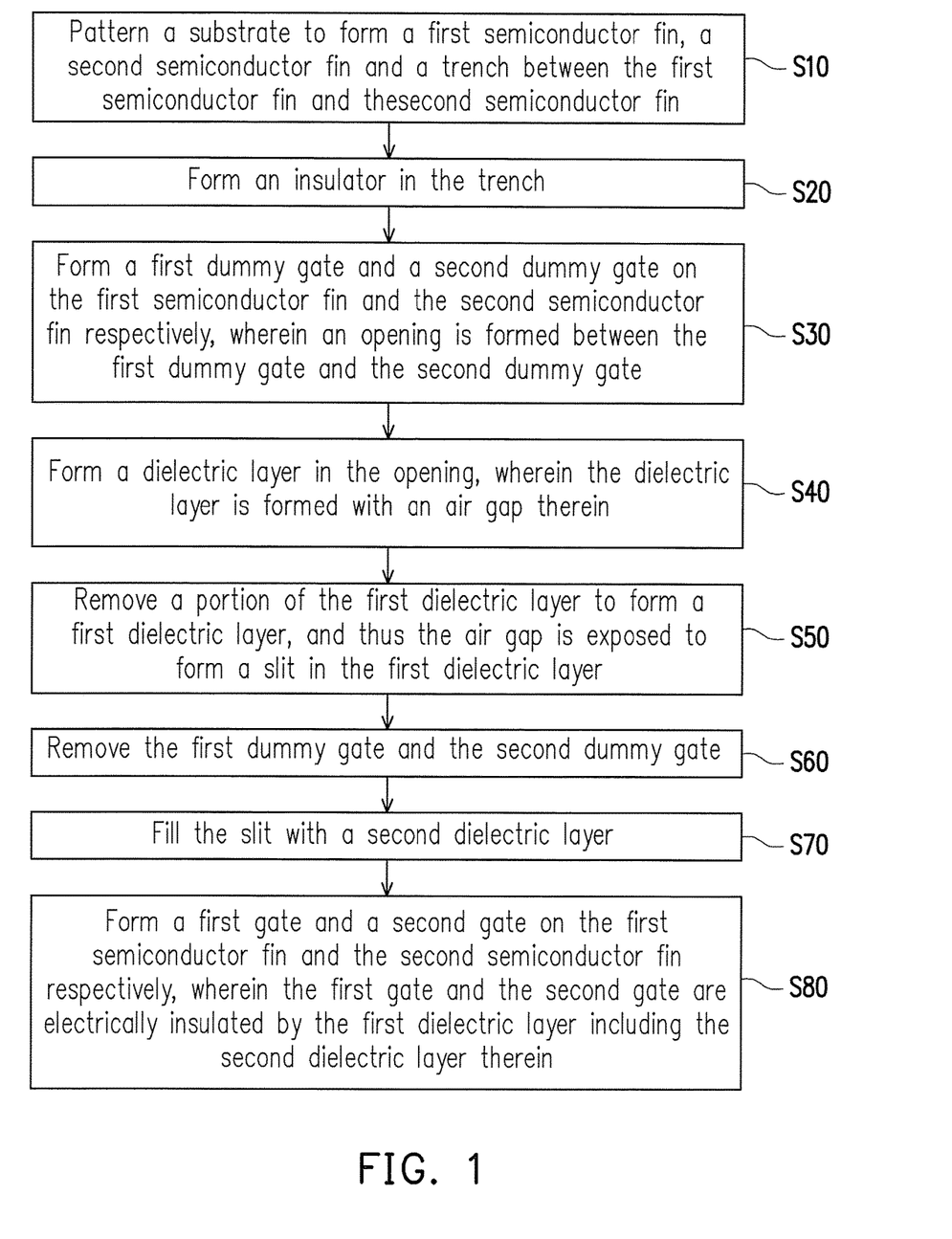
FIG. 1 illustrates a flow chart illustrating a method for fabricating a FinFET in accordance with some embodiments of the present disclosure.

FIG. 1 illustrates a flow chart illustrating a method for fabricating a FinFET in accordance with some embodiments of the present disclosure. Referring to FIG. 1, the method at least includes Step S10, Step S20, Step S30, Step S40, Step S50, Step S60, Step S70 and Step S80. First, in Step S10, a substrate is patterned to form a first semiconductor fin, a second semiconductor fin and a trench between the first semiconductor fin and the second semiconductor fin. Then, in Step S20, an insulator is formed in the trench. In Step S30, a first dummy gate and a second dummy gate are formed on the first semiconductor fin and the second semiconductor fin respectively, wherein an opening is formed between the first dummy gate and the second dummy gate. In Step S40, a first dielectric layer is formed in the opening, wherein the first dielectric layer is formed with an air gap therein. In Step S50, a portion of the first dielectric layer is removed to form a first dielectric layer, and thus the air gap is exposed to form a slit in the first dielectric layer. In Step S60, the first dummy gate and the second dummy gate are removed. In Step S70, a second dielectric layer fills the slit. Thereafter, in Step S80, a first gate and a second gate are formed on the first semiconductor fin and the second semiconductor fin respectively, wherein the first gate and the second gate are electrically insulated by the first dielectric layer including the second dielectric layer therein.

Figure 2A:
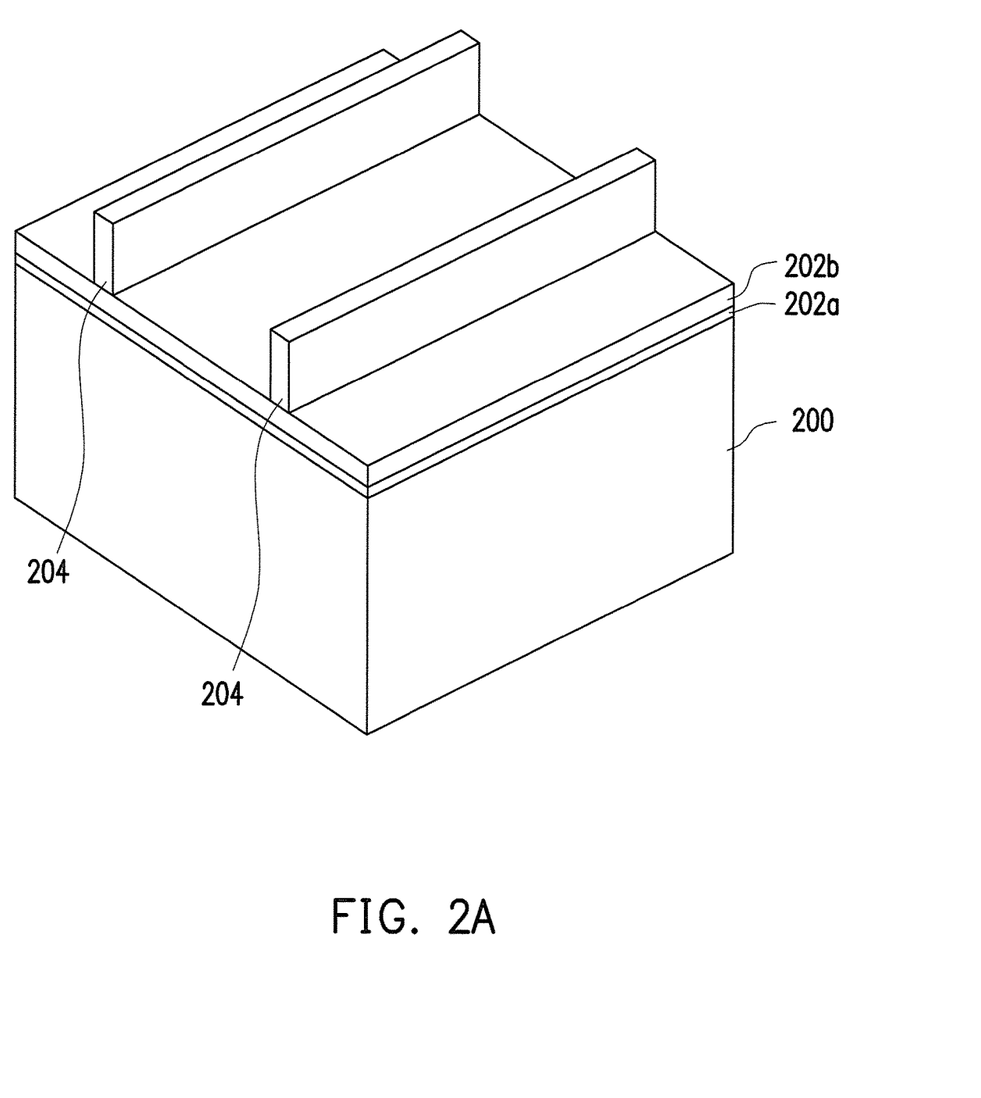
FIGS. 2A-2L are perspective views of a method for fabricating a FinFET in accordance with some embodiments of the present disclosure.

FIG. 2A is a perspective view of the FinFET at one of various stages of the fabricating method. In Step 10 in FIG. 1 and as shown in FIG. 2A, a substrate 200 is provided. In some embodiments, the substrate 200 includes a crystalline silicon substrate (e.g., wafer). The substrate 200 may include various doped regions depending on design requirements (e.g., p-type substrate or n-type substrate). In some embodiments, the doped regions may be doped with p-type and/or n-type dopants. For example, the doped regions may be doped with p-type dopants, such as boron or $BF_2$; n-type dopants, such as phosphorus or arsenic; and/or combinations thereof. The doped regions may be configured for an n-type FinFET, a p-type FinFET or the combination thereof. In alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide.

In some embodiments, a pad layer 202a and a mask layer 202b are sequentially formed on the substrate 200. The pad layer 202a may be a silicon oxide thin film formed, for example, by thermal oxidation process. The pad layer 202a may act as an adhesion layer between the substrate 200 and mask layer 202b. The pad layer 202a may also act as an etch stop layer for etching the mask layer 202b. In at least one embodiment, the mask layer 202b is a silicon nitride layer formed, for example, by low-pressure chemical vapor deposition (LPCVD) or plasma enhanced chemical vapor deposition (PECVD). The mask layer 202b is used as a hard mask during subsequent photolithography processes. Then, a patterned photoresist layer 204 having predetermined patterns is formed on the mask layer 202b.

Figure 2B:
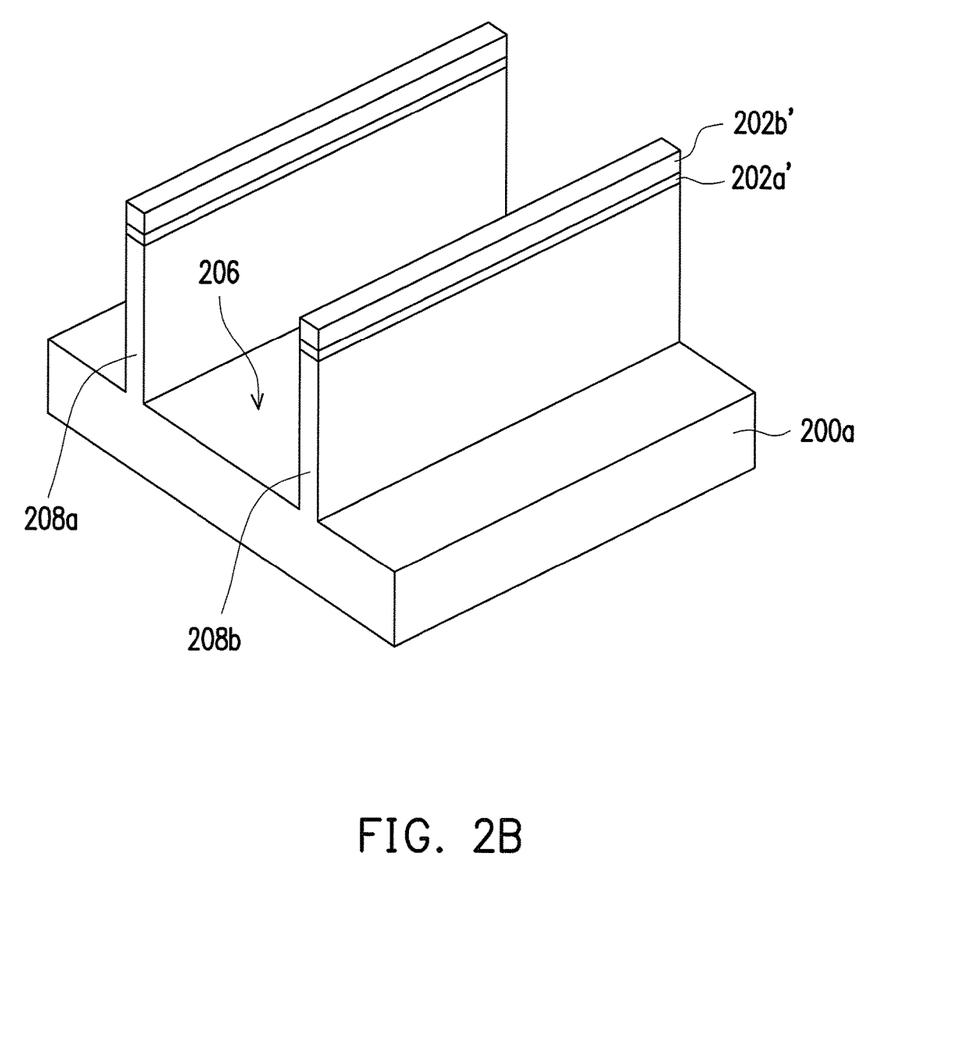

FIG. 2B is a perspective view of the FinFET at one of various stages of the fabricating method. In Step S10 in FIG. 1 and as shown in FIGS. 2A-2B, the mask layer 202b and the pad layer 202a which are not covered by the patterned photoresist layer 204 are sequentially etched to form a patterned mask layer 202b' and a patterned pad layer 202a' so as to expose underlying substrate 200. Then, by using the patterned mask layer 202b', the patterned pad layer 202a' and the patterned photoresist layer 204 as a mask, portions of the substrate 200 are exposed and removed to form a first semiconductor fin 208a and a second semiconductor fin 208b and a trench 206 between the first semiconductor fin 208a and the second semiconductor fin 208b. After the substrate 200 is patterned, the first semiconductor fin 208a and the second semiconductor fin 208b are covered by the patterned mask layer 202b', the patterned pad layer 202a' and the patterned photoresist layer 204.

The widths of the first semiconductor fin 208a and the second semiconductor fin 208b are, for example, smaller than about 30 nm, respectively. The heights of the first semiconductor fin 208a and the second semiconductor fin 208b range from about 5 nm to about 500 nm, respectively. After the trench 206 and the first semiconductor fin 208a and the second semiconductor fin 208b are formed, the patterned photoresist layer 204 is then removed. In some embodiments, a cleaning process may be performed to remove a native oxide of the semiconductor substrate 200a and the first semiconductor fin 208a and the second semiconductor fin 208b. The cleaning process may be performed using diluted hydrofluoric (DHF) acid or other suitable cleaning solutions.

Figure 2C:
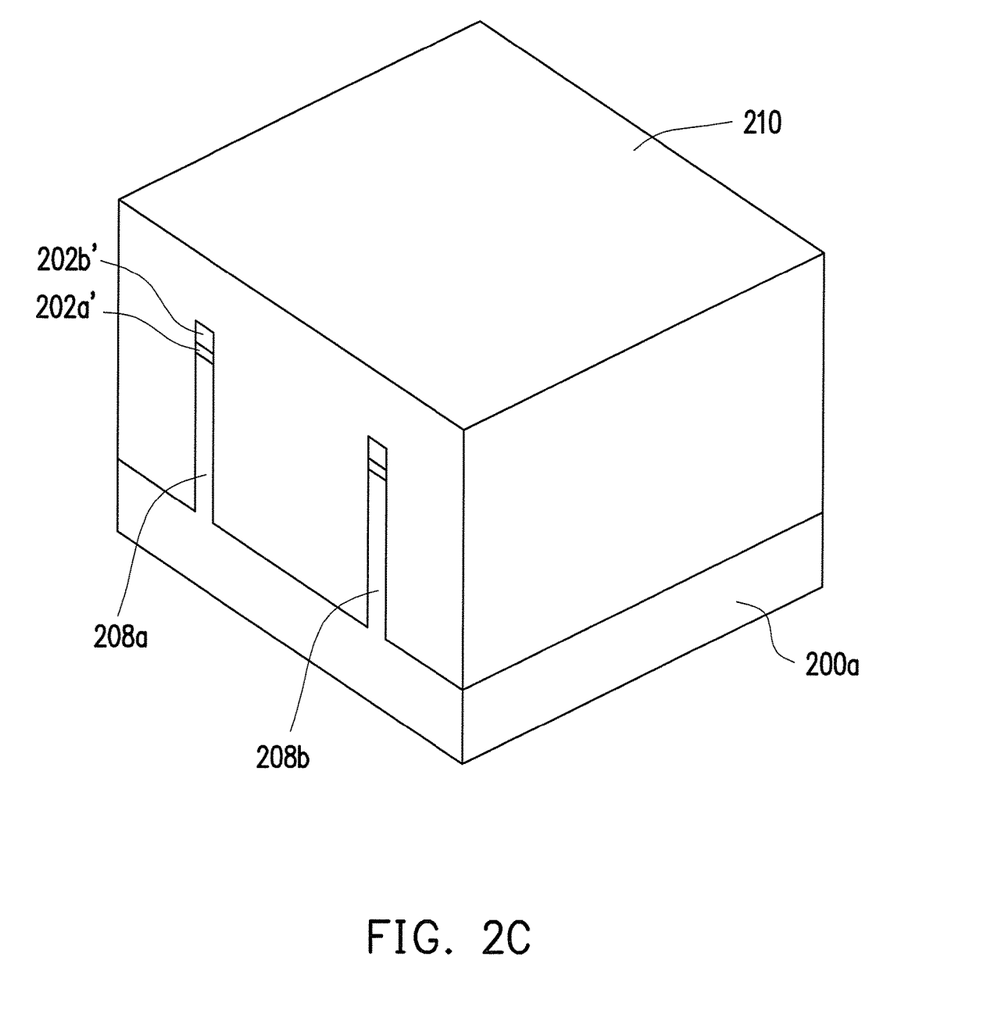

FIG. 2C is a perspective view of the FinFET at one of various stages of the fabricating method. In Step S20 in FIG. 1 and as shown in FIGS. 2B-2C, an insulating material 210 is formed over the substrate 200a to cover the first semiconductor fin 208a and the second semiconductor fin 208b and fills up the trench 206. In addition to the first semiconductor fin 208a and the second semiconductor fin 208b, the insulating material 210 further covers the patterned pad layer 202a' and the patterned mask layer 202b', for example. The insulating material 210 may include silicon oxide, silicon nitride, silicon oxynitride, a spin-on dielectric material, or a low-K dielectric material. The insulating material 210 may be formed by high-density-plasma chemical vapor deposition (HDP-CVD), sub-atmospheric CVD (SACVD) or by spin-on.

Figure 2D:
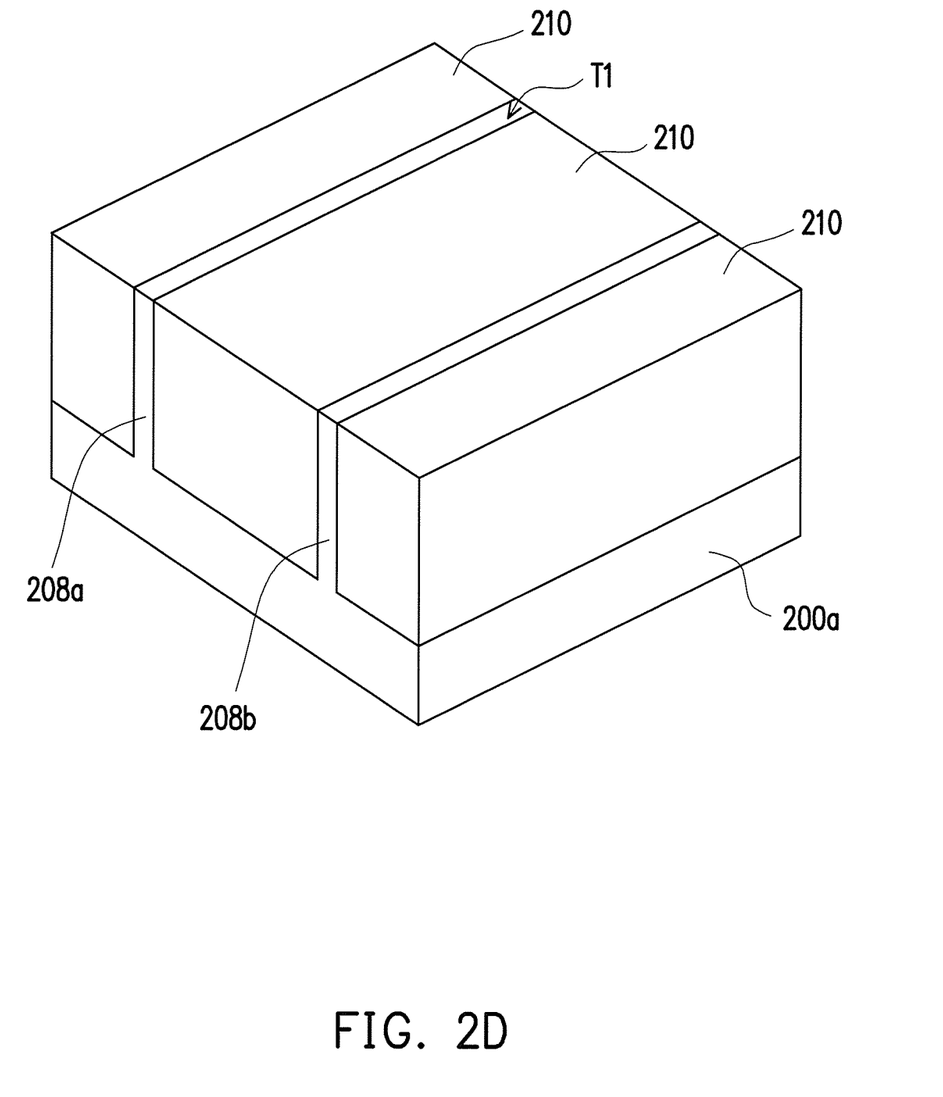

FIG. 2D is a perspective view of the FinFET at one of various stages of the fabricating method. In Step S20 in FIG. 1 and as shown in FIGS. 2C-2D, a polish process such as chemical mechanical polish process is, for example, performed to remove a portion of the insulating material 210, the patterned mask layer 202b' and the patterned pad layer 202a' until the first semiconductor fin 208a and the second semiconductor fin 208b are exposed. As shown in FIG. 2D, after the insulating material 210 is polished, top surfaces of the polished insulating material 210 is substantially coplanar with top surfaces T1 of the first semiconductor fin 208a and the second semiconductor fin 208b.

Figure 2E:
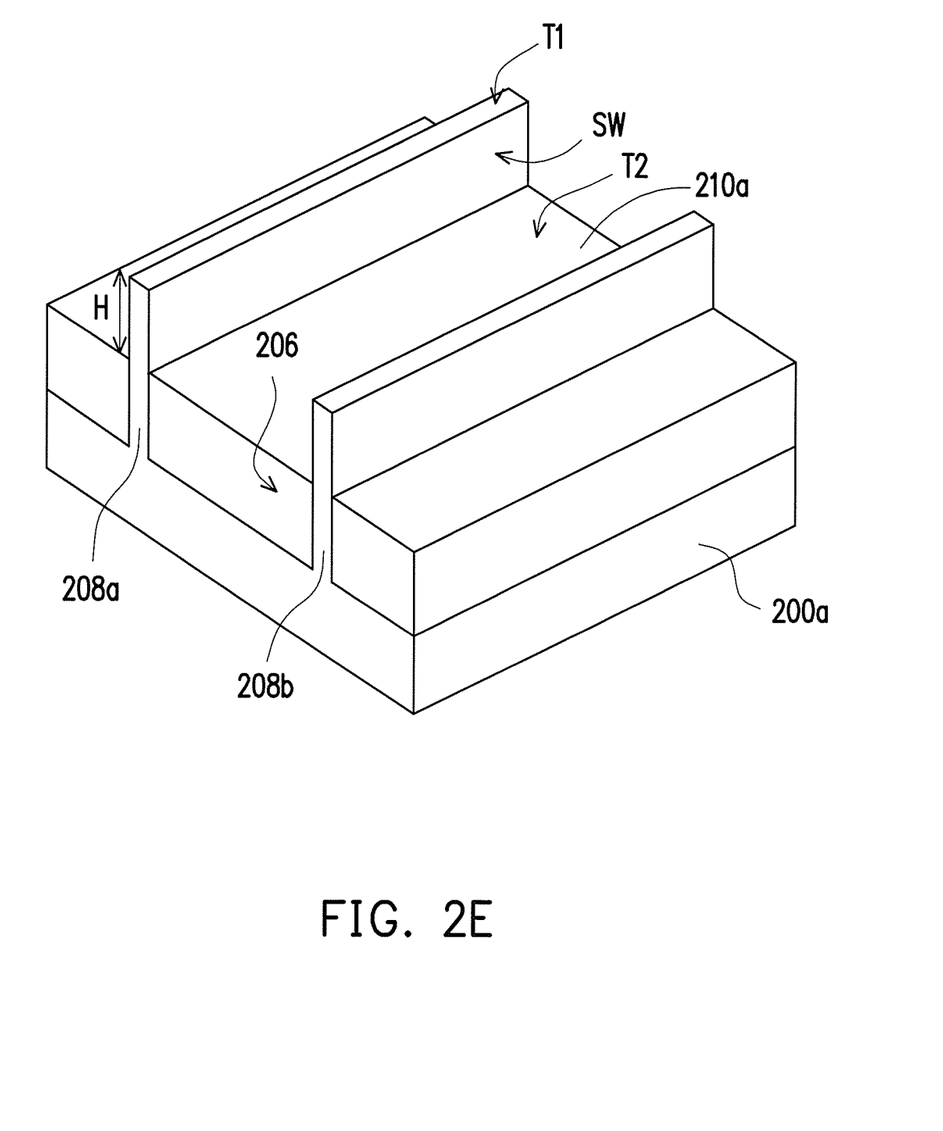

FIG. 2E is a perspective view of the FinFET at one of various stages of the fabricating method. In Step S20 in FIG. 1 and as shown in FIGS. 2D-2E, the polished insulating material 210 filled in the trench 206 is partially removed by an etching process such that an insulator 210a is formed on the substrate 200a and located between the first semiconductor fin 208a and the second semiconductor fin 208b. In some embodiments, the etching process may be a wet etching process with hydrofluoric acid (HF) or a dry etching process. The top surface T2 of the insulator 210a is lower than the top surfaces T1 of the first semiconductor fin 208a and the second semiconductor fin 208b. In other words, the first semiconductor fin 208a and the second semiconductor fin 208b protrude from the top surface T2 of the insulator 210a and sidewalls SW of the first semiconductor fin 208a and the second semiconductor fin 208b are thus exposed. The height difference between the top surfaces T1 of the first semiconductor fin 208a and the second semiconductor fin 208b and the top surface T2 of the insulator 210a is H, and the height difference H ranges from about 15 nm to about 50 nm. The insulator 210a partially covers sidewalls of the first semiconductor fin 208a and the second semiconductor fin 208b.

Figure 2F:
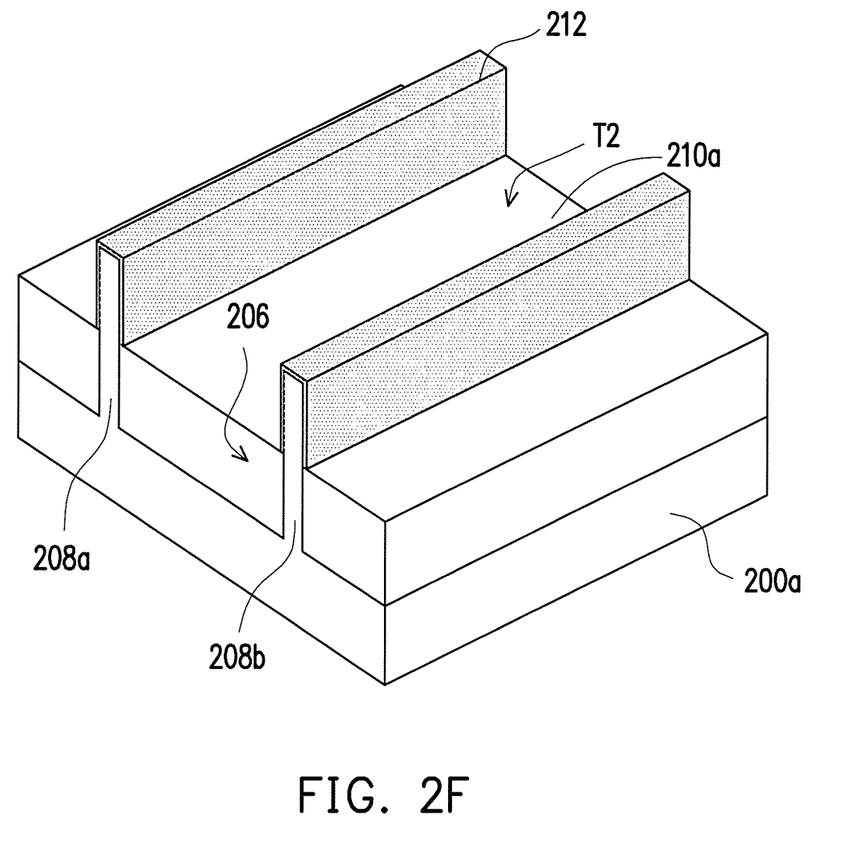

FIG. 2F is a perspective view of the FinFET at one of various stages of the fabricating method. In Step S30 in FIG. 1 and as shown in FIGS. 2E-2F, after the insulator 210a is formed, a dielectric layer 212 is formed to conformally cover the top surfaces T1 and the sidewalls SW of the first semiconductor fin 208a and the second semiconductor fin 208b, for example. In alternative embodiments, the dielectric layer 212 further conformally covers the top surface T1 of the insulator 210a. In some embodiments, the dielectric layer 212 may include silicon oxide, silicon nitride or silicon oxy-nitride. In some embodiments, the dielectric layer 212 is a high-k dielectric layer with a thickness in the range of about 0.2 nm to 5 nm. The dielectric layer 212 may be formed by a suitable process such as atomic layer deposition (ALD), chemical vapor deposition (CVD), physical vapor deposition (PVD), thermal oxidation or UV-ozone oxidation.

Figure 2G:
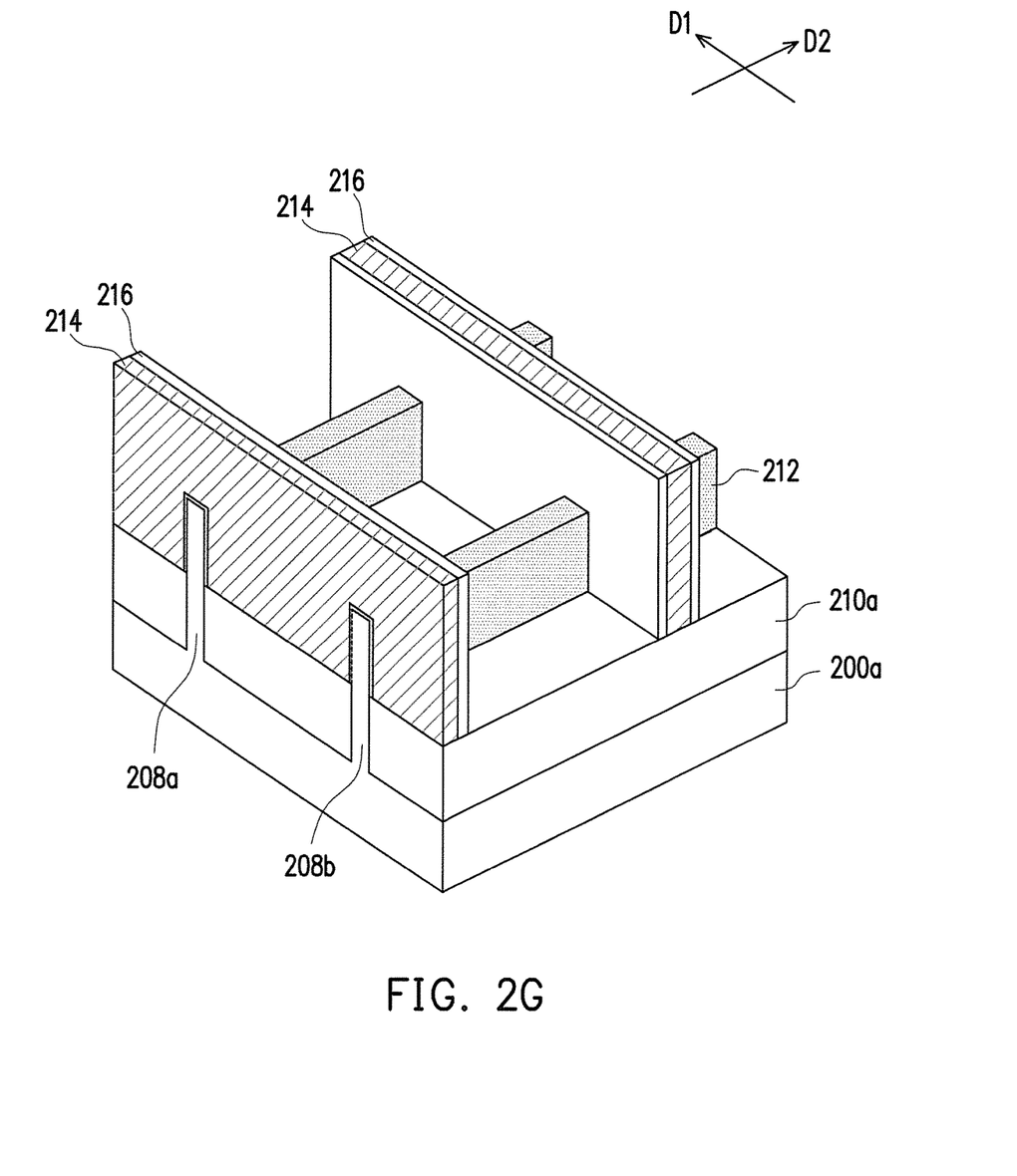

FIG. 2G is a perspective view of the FinFET at one of various stages of the fabricating method. In Step S30 in FIG. 1 and as shown in FIGS. 2F-2G, a dummy gate strip 214 is formed on the first semiconductor fin 208a and the second semiconductor fin 208b, wherein a lengthwise direction D1 of the dummy gate strip 214 is different from lengthwise directions D2 of the first semiconductor fin 208a and the second semiconductor fin 208b. The lengthwise direction D1 of the dummy gate strip 214 is perpendicular to the lengthwise directions D2 of the first semiconductor fin 208a and the second semiconductor fin 208b, for example. Two dummy gate strips 214 shown in FIG. 2G are merely for illustration, in alternative embodiments, more dummy gate strips 214 may be formed in accordance with actual design requirements. The dummy gate strip 214 includes a silicon-containing material, such as poly-silicon, amorphous silicon or a combination thereof. The dummy gate strip 214 may be formed by a suitable deposition process such as chemical vapor deposition (CVD) and physical vapor deposition (PVD) and a suitable planarization process such as chemical mechanical polish. In some embodiments, the width of the dummy gate strip 214 ranges from 5 nm to 50 nm.

In some embodiments, after the dummy gate strip 214 is formed, a pair of spacers 216 is formed on sidewalls of the dummy gate strip 214. The spacers 216 is formed on the insulator 210a and extends along the sidewalls of the dummy gate strip 214. The spacers 216 are formed of dielectric materials, such as silicon nitride or SiCON. The spacers 216 may include a single layer or multilayer structure. Since the pair of spacers 216 is spaced apart by the dummy gate strip 214, a gap between the pair of spacers 216 substantially equals to the width of the dummy gate strip 214.

Figure 2H:
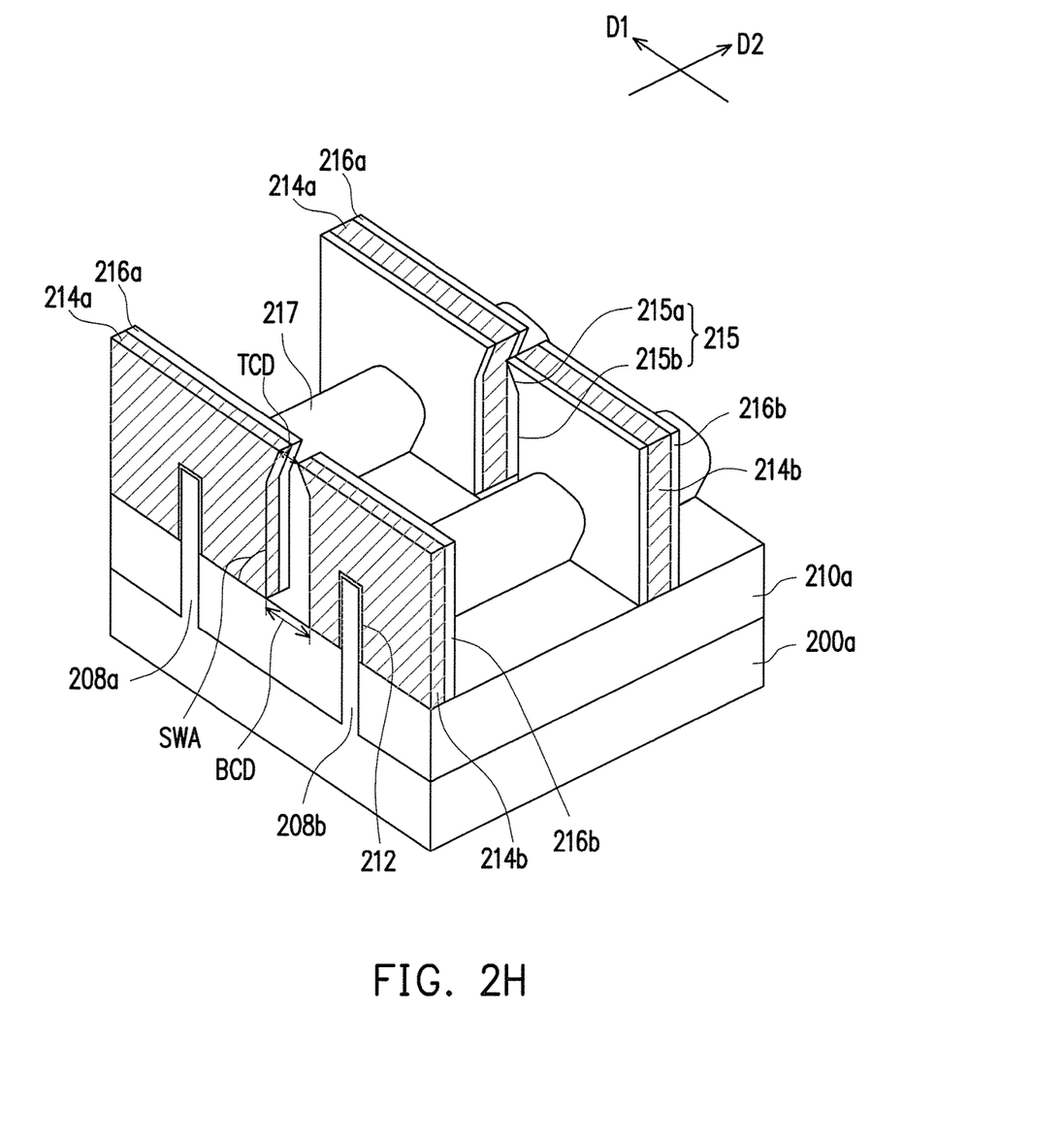

FIG. 2H is a perspective view of the FinFET at one of various stages of the fabricating method. In Step S30 in FIG. 1 and as shown in FIGS. 2G-2H, a portion of the dummy gate strip 214 is removed to form an opening 215, and the remained dummy gate strip 214 is divided into a first dummy gate 214a and a second dummy gate 214b by the opening 215 therebetween. In some embodiments, a portion of the spacers 216 is also removed when forming the opening 215, and thus the remained spacers 216 is divided into spacers 216a and spacers 216b by the opening 215 therebetween. In some embodiments, the first dummy gate 214a and the second dummy gate 214b are formed on the first semiconductor fin 208a and the second semiconductor fin 208b respectively, and the opening 215 is disposed on the insulator 210a and between the first dummy gate 214a and the second dummy gate 214b. In some embodiments, along the lengthwise direction D1, a top critical dimension TCD of the opening 215 may be different from a bottom critical dimension BCD of the opening 215. For example, the top critical dimension TCD of the opening 215 is smaller than the bottom critical dimension BCD of the opening 215. In some embodiments, the top critical dimension TCD and the bottom critical dimension BCD of the opening 215 range from 5 nm to 500 nm. In some embodiments, the top portion 215a of the sidewalls of the opening 215 is inclined, and the bottom portion 215b of the sidewalls of the opening 215 is substantially straight. In some embodiments, a height of the top portion 215a is smaller than a height of the bottom portion 215b. In some embodiments, the height of the top portion 215a to the height of the bottom portion 215b ranges from ⅓ to ⅛. In some embodiments, an included angle SWA formed between the sidewalls of the opening 215 and the insulator 210a is, for example, substantially equal to 90 degrees. The opening 215 may be formed by an etching process. The process forming the first dummy gate 214a and the second dummy gate 214b by cutting the dummy gate strip 214 is also referred to an end cut process, and end of the formed first dummy gate 214a is adjacent to one end of the formed second dummy gate 214b. In some embodiments, an aspect ratio of the opening 215 is larger than about 3, larger than about 5, larger than about 7, larger than 10 or even larger than about 15. In some embodiments, the aspect ratio of the opening 215 ranges from 7 to 10. Herein, the aspect ratio of an opening is defined as the ratio of the longest side to the shortest side. In some embodiments, a shape as shown in FIG. 2H is utilized as example to illustrate the opening 215, however, it is not intended to limit the shape of the opening 215.

In some embodiments, source/drain regions 217 are formed at two opposite sides of the first dummy gate 214a and the second dummy gate 214b. In some embodiments, the exposed upper portions of the first and second semiconductor fins 208a, 208b are removed by using a suitable technique such as an anisotropic etching process, and therefore, recesses (not shown) are formed in the insulator 210a. In some embodiments, the exposed upper portions of the first and second semiconductor fins 208a, 208b are removed by using the first dummy gate 214a, the second dummy gate 214b, the spacers 216a, and the spacers 216b as an etch mask. That is, the step of forming the recesses is considered a self-aligned etching step. In some embodiments, an enlarging step and/or a rounding step can be included after the recess forming step, so the resulting recess profile can have a diamond-like shape, a bucket-like shape or the like.

Thereafter, the source/drain regions 217 are formed by selectively growing epitaxy layers from the recesses. Specifically, the source/drain regions 217 are formed within the recesses and extend upwardly along the sidewalls of the corresponding spacers 110. In some embodiments, the source/drain regions 217 include silicon germanium, silicon carbon or silicon phosphate. In some embodiments, the source/drain regions 217 include silicon germanium (SiGe) for a P-type FinFET device. In alternative embodiments, the source/drain regions 217 include silicon carbon (SiC), silicon phosphate (SiP), SiCP or a SiC/SiP multilayer structure for an N-type FinFET device. In some embodiments, the source/drain regions 217 may be optionally implanted with an N-type dopant or a P-type dopant as needed. In some embodiments, the adjacent source/drain regions 217 at the same side are separate from each other, as shown in FIG. 2H. In alternative embodiments, the adjacent source/drain regions 217 at the same side are connected. Following the formation of the source/drain regions 217, silicide regions may be formed by siliciding the top portions of the source/drain regions 217.

Figure 2I:
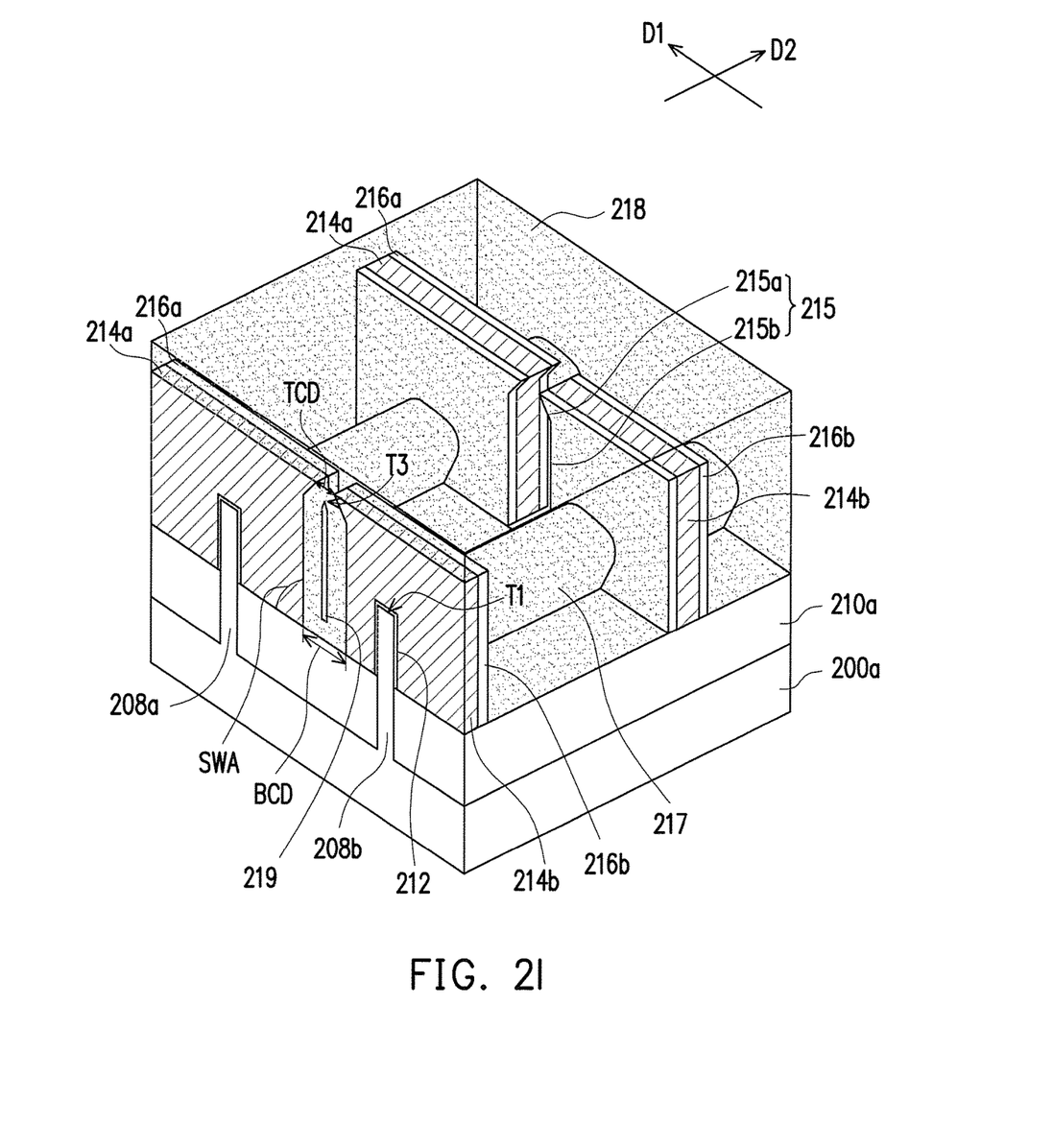

FIG. 2I is a perspective view of the FinFET at one of various stages of the fabricating method. In Step S40 in FIG. 1 and as shown in FIGS. 2H-2I, a first dielectric material 218 fills in the opening 215 and forms with an air gap 219 therein. In some embodiments, the first dielectric material 218 is formed over the substrate 200a to fill in the opening 215 and cover the first dummy gate 214a and the second dummy gate 214b. The first dielectric material 218 may include silicon oxide, silicon nitride, silicon oxynitride, or a low-K dielectric material. The first dielectric material 218 formed with the air gap 219 therein may be formed by chemical vapor deposition (CVD) or physical vapor deposition (PVD). In some embodiments, the air gap 219 is formed simultaneously with the first dielectric material 218. In some embodiments, a top surface T3 of the air gap 219 is substantially higher than top surfaces T1 of the first semiconductor fin 208a and the second semiconductor fin 208b. In some embodiments, the top surface T3 of the air gap 219 is slightly lower than top surfaces of the first dummy gate 214a and the second dummy gate 214b. In some embodiments, before the first dielectric material 218 is formed, some processes (e.g. removal process of dielectric layer covering the insulator 210a, fin recessing process, strained source/drain epitaxial process on the semiconductor fins, silicidation process and so on) may be performed in advance. Details of the aforesaid processes are omitted. In some embodiments, a shape as shown in FIG. 2I is utilized as example to illustrate the air gap 219, however, it is not intended to limit the shape of the air gap 219. For example, the air gap 219 may be form in circle, ellipse, or other irregular shapes. Furthermore, one air gap 219 in the first dielectric material 218 shown in FIG. 2I is merely for illustration, in alternative embodiments, two or more air gaps 219 may be formed in accordance with actual design requirements.

Figure 2J:
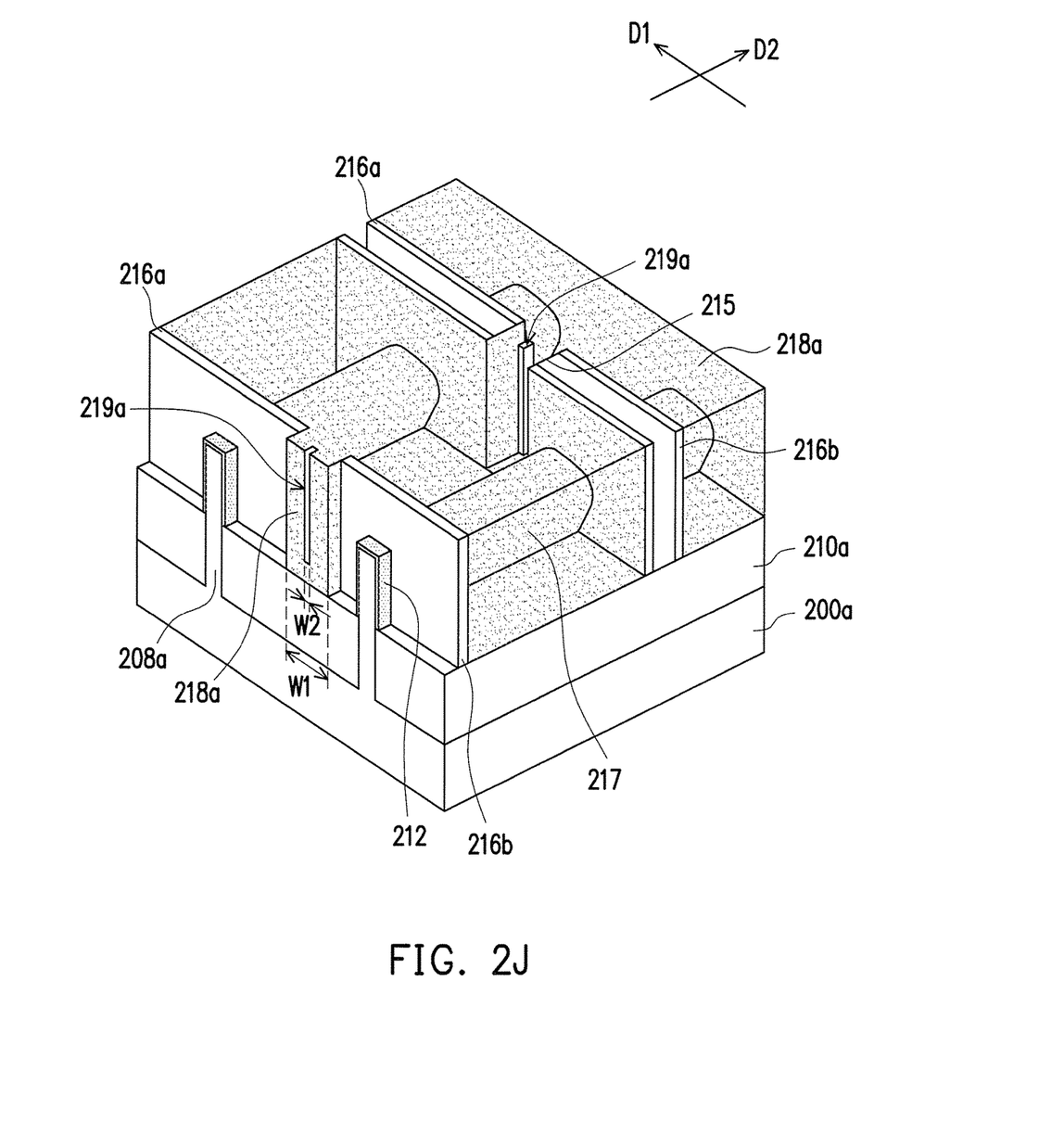

FIG. 2J is a view of the FinFET at one of various stages of the fabricating method. In Steps S50 and S60, in FIG. 1 and as shown in FIGS. 2I-2J, a portion of the first dielectric material 218 is removed to form a first dielectric layer 218a, and thus the air gap 219 is exposed to form a slit 219a in the first dielectric layer 218a. The first dummy gate 214a and the second dummy gate 214b are exposed. In some embodiments, a polish process such as chemical mechanical polish process is, for example, performed to remove a portion of the first dielectric material 218, a portion of the first dummy gate 214a, and a portion of the second dummy gate 214b until the air gap 219, the first dummy gate 214a and the second dummy gate 214b are exposed. In some embodiments, the opening 215 has a first width W1 in the lengthwise direction D1 of the first dummy gate 214a and the second dummy gate 214b, the slit 219a has a second width W2 in the lengthwise direction D1, and a ratio of the first width W1 to the second width W2 is larger than 2, larger than 3, larger than 4, larger than 5, larger than 6, larger than 7, larger than 8, larger than 9, larger than 10 or even larger than 15. In some embodiments, the second width W2 of the slit 219a is about 10 nm, and the first width W1 of the opening 215 is larger than 100 nm. In some embodiments, an aspect ratio of the slit 219a is larger than about 3, larger than 5, larger than 7, larger than 10, larger than 12, or even larger than 15. In some embodiments, the slit 219a has an aspect ratio larger than 10. In some embodiments, after removing a portion of the first dielectric material 218, along the lengthwise direction D1, a top critical dimension TCD of the opening 215 is substantially equal to a bottom critical dimension BCD of the opening 215. In alternative embodiments, the opening 215 may have a top critical dimension TCD different from a bottom critical dimension BCD thereof. In some embodiments, a shape as shown in FIG. 2J is utilized as example to illustrate the slit 219a, however, it is not intended to limit the shape of the slit 219a.

Then, the remained first dummy gate 214a and the remained second dummy gate 214b are removed. In some embodiments, the first dummy gate 214a and the second dummy gate 214b are removed, for example, by an etching process. Through properly selecting of etchant, the first dummy gate 214a and the second dummy gate 214b are removed without damaging the first dielectric layer 218a and the dielectric layer 212 significantly.

Figure 2K:
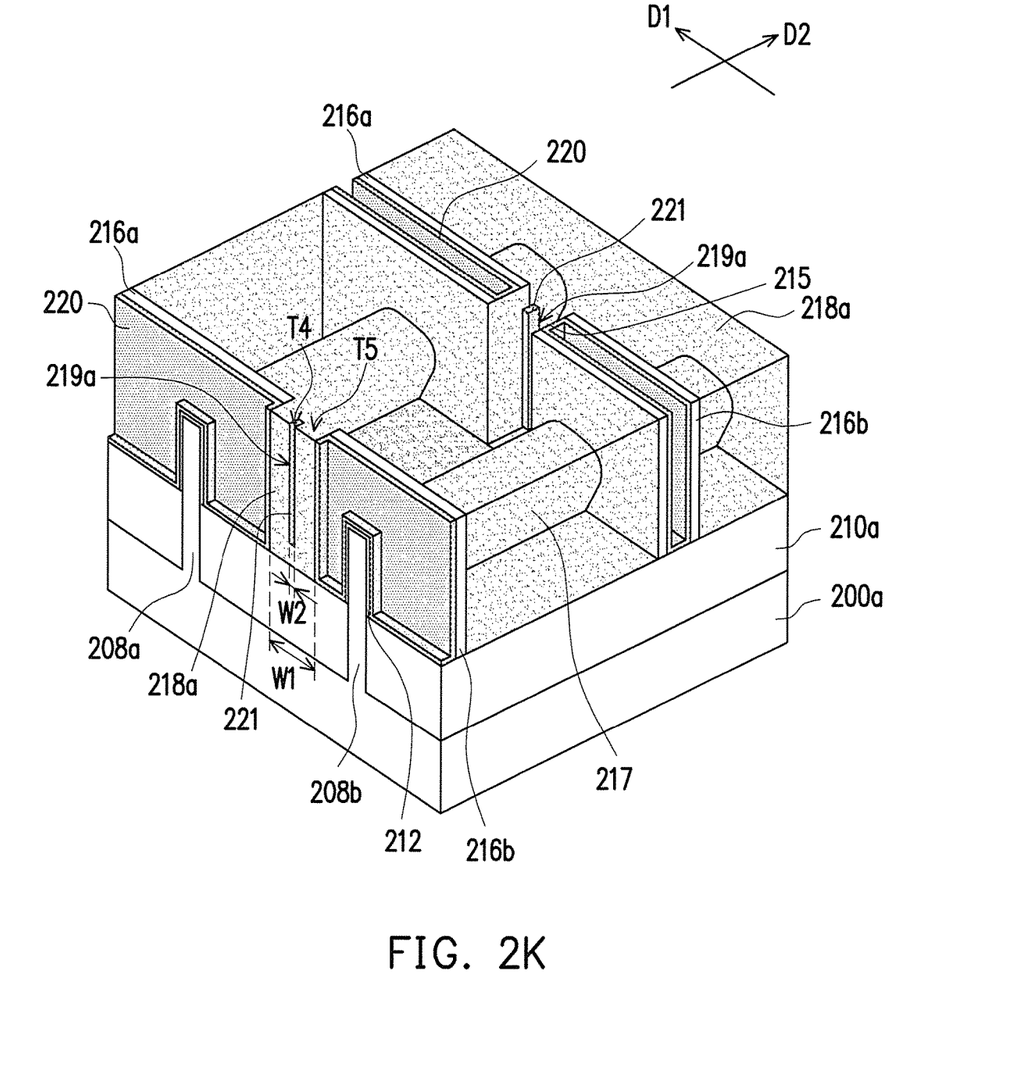

FIG. 2K is a view of the FinFET at one of various stages of the fabricating method. In Step S70, in FIG. 1 and as shown in FIGS. 2J-2K, a second dielectric layer 221 fills the slit 219a. In some embodiments, the second dielectric layer 221 is formed by atomic layer deposition or other suitable method. A material of the second dielectric layer 221 is different from a material of the first dielectric layer 218a. In some embodiments, the second dielectric layer 221 may include a high-k material having a dielectric constant greater than about 10. In some embodiments, the high-k material includes metal oxide, such as ZrO$_2$, Gd$_2$O$_3$, HfO$_2$, BaTiO$_3$, Al$_2$O$_3$, LaO$_2$, TiO$_2$, Ta$_2$O$_5$, Y$_2$O$_3$, STO, BTO, BaZrO, HfZrO, HfLaO, HfTaO, HfTiO, a combination thereof, or a suitable material. In alternative embodiments, the second dielectric layer 221 can optionally include a silicate such as HfSiO, LaSiO, AlSiO, a combination thereof, or a suitable material. In some embodiments, a top surface T4 of the second dielectric layer 221 is substantially coplanar with a top surface T5 of the first dielectric layer 218a. In some embodiments, the first dielectric layer 218a surrounds the second dielectric layer 221.

In some embodiments, a gate dielectric layer 220 is formed over the dielectric layer 212 covering the first semiconductor fin 208a and the second semiconductor fin 208b, the insulator 210a and sidewalls SW of the first dielectric layer 218a. In some embodiments, the gate dielectric layer 220 is formed simultaneously with the second dielectric layer 221. In some embodiments, the gate dielectric layer 220 may include a high-k material having a dielectric constant greater than about 10. In some embodiments, the high-k material includes metal oxide, such as ZrO$_2$, Gd$_2$O$_3$, HfO$_2$, BaTiO$_3$, Al$_2$O$_3$, LaO$_2$, TiO$_2$, Ta$_2$O$_5$, Y$_2$O$_3$, STO, BTO, BaZrO, HfZrO, HfLaO, HfTaO, HMO, a combination thereof, or a suitable material. In alternative embodiments, the gate dielectric layer 220 can optionally include a silicate such as HfSiO, LaSiO, AlSiO, a combination thereof, or a suitable material. In some embodiments, the gate dielectric layer 220 has a thickness in the range of about 5 nm to 50 nm. The gate dielectric layer 220 is, for example, thicker than the dielectric layer 212.

Figure 2L:
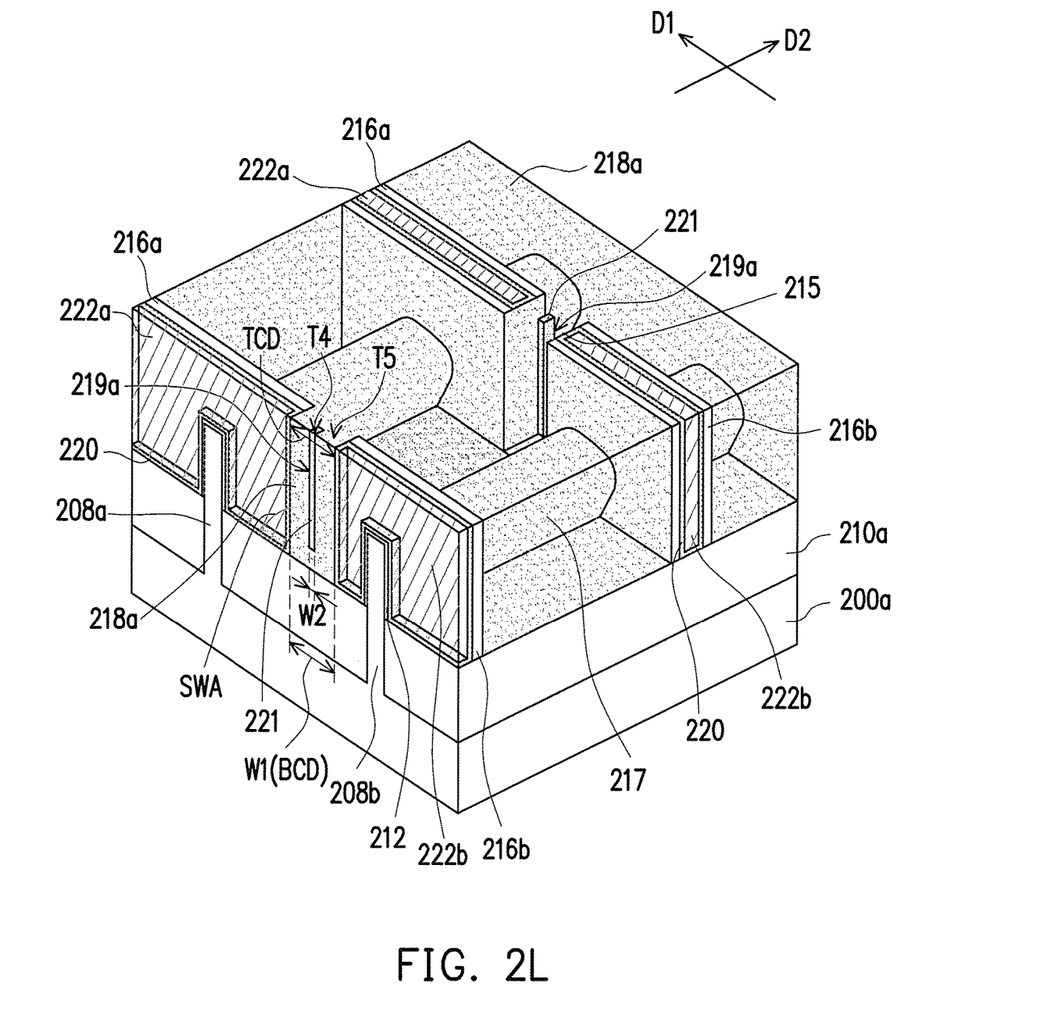

FIG. 2L is a view of the FinFET at one of various stages of the fabricating method. In Step S80, in FIG. 1 and as shown in FIGS. 2K-2L, a first gate 222a and a second gate 222b are formed to cover the gate dielectric layer 220. The gate dielectric layer 220 is disposed between the first gate 222a and the first semiconductor fin 208a and the second gate 222b and the second semiconductor fin 208b. In some embodiments, the first gate 222a and the second gate 222b may include a single layer or multi-layered structure. In some embodiments, the first gate 222a and the second gate 222b may include metal, such as Al, Cu, W, Ti, Ta, TiN, TiAl, TiAlN, TaN, NiSi, CoSi, other conductive materials with a work function compatible with the substrate material, or combinations thereof. In some embodiments, a thickness of the first gate 222a and the second gate 222b is, for example, in the range of about 30 nm to about 60 nm. The first gate 222a and the second gate 222b may be formed by a suitable process such as ALD, CVD, PVD, plating, or combinations thereof.

In some embodiments, the width of the first gate 222a ranges from 5 nm to 50 nm, and the width of the second gate 222b ranges from 5 nm to 50 nm. The portion of the first semiconductor fin 208a that is overlapped with and covered by the first gate 222a serves as a channel of a FinFET; and the portion of the second semiconductor fin 208b that is overlapped with and covered by the second gate 222b serves as a channel of a FinFET. In some embodiments, one slit 219a between the first gate 222a and the second gate 222b is merely for illustration, in alternative embodiments, two or more slits 219a may be formed between the first gate 222a and the second gate 222b in accordance with actual design requirements. Accordingly, more dielectric layers 221 may fill up slits 219a between the first gate 222a and the second gate 222b, and the dielectric layers 221 may have same material or different materials.

In some embodiments, the first dielectric layer is formed with at least one slit, and the second dielectric layer fills up the slit, wherein the first dielectric layer and the second dielectric layer have different materials. Therefore, the dielectric materials, such as the first dielectric layer and the second dielectric layer, formed in the opening between the first gate and the second gate together provide good insulation for the first gate and the second gate. Accordingly, the dimension of the opening between the first gate and the second gate may be adjusted based on the materials formed in the opening and filled in the slit. Furthermore, the line-end bridge defect and the leakage are prevented, and yield and reliability of the FinFET are enhanced.

In accordance with some embodiments of the present disclosure, a fin field effect transistor (FinFET) is provided. The FinFET includes a substrate, an insulator, a first gate, a second gate, an opening, a first dielectric layer and a second dielectric layer. The substrate includes a first semiconductor fin, a second semiconductor fin and a trench between the first semiconductor fin and the second semiconductor fin. The insulator is disposed in the trench. The first gate is disposed on the first semiconductor fin. The second gate is disposed on the second semiconductor fin. The opening is disposed between the first gate and the second gate. The first dielectric layer is disposed in the opening to electrically insulate the first gate and the second gate, wherein the first dielectric layer includes a slit. The second dielectric layer is filled in the slit, wherein the opening has a first width in a direction along which the first gate and the second gate extend, the slit has a second width in the direction, and a ratio of the first width to the second width is larger than 2.

In accordance with alternative embodiments of the present disclosure, a fin field effect transistor (FinFET) is provided. The FinFET includes a substrate, an insulator, a first gate, a second gate, an opening, a first dielectric layer and a second dielectric layer. The substrate includes a first semiconductor fin, a second semiconductor fin and a trench between the first semiconductor fin and the second semiconductor fin. The insulator is disposed in the trench. The first gate is disposed on the first semiconductor fin. The second gate is disposed on the second semiconductor fin. The opening is disposed between the first gate and the second gate. The first dielectric layer is disposed in the opening to electrically insulate the first gate and the second gate, wherein the first dielectric layer includes a slit. The second dielectric layer is filled in the slit, wherein the slit has an aspect ratio larger than 10.

In accordance with yet alternative embodiments of the present disclosure, a method for fabricating a fin field effect transistor (FinFET) is provided. A substrate is patterned to form a first semiconductor fin, a second semiconductor fin and a trench between the first semiconductor fin and the second semiconductor fin. An insulator is formed in the trench. A first dummy gate and a second dummy gate are formed on the first semiconductor fin and the second semiconductor fin respectively, wherein an opening is formed between the first dummy gate and the second dummy gate. A first dielectric material is formed in the opening, wherein the first dielectric material is formed with an air gap therein. A portion of the first dielectric material is removed to form a first dielectric layer, and thus the air gap is exposed to form a slit in the first dielectric layer. The first dummy gate and the second dummy gate are removed. A second dielectric layer is formed to fill the slit. A first gate and a second gate are formed on the first semiconductor fin and the second semiconductor fin respectively, wherein the first gate and the second gate are electrically insulated by the first dielectric layer including the second dielectric layer therein.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
    a substrate comprising a first semiconductor fin, a second semiconductor fin and a trench between the first semiconductor fin and the second semiconductor fin;
    an insulator disposed in the trench;
    a first gate disposed on the first semiconductor fin;
    a second gate disposed on the second semiconductor fin, wherein top surfaces of the first and second gates are above a top surface of the insulator;
    an opening disposed between the first gate and the second gate and above the insulator;
    a first dielectric layer disposed in the opening to electrically insulate the first gate and the second gate, wherein the first dielectric layer comprises a slit; and
    a second dielectric layer filled in the slit, wherein the opening has a first width in a direction along which the first gate and the second gate extend, the slit has a second width in the direction, and a ratio of the first width to the second width is larger than 2.

2. The FinFET of claim 1, wherein a top surface of the second dielectric layer is substantially coplanar with a top surface of the first dielectric layer.

3. The FinFET of claim 1, wherein a top critical dimension of the opening is substantially equal to a bottom critical dimension of the opening.

4. The FinFET of claim 1 further comprising a third dielectric layer disposed between the first semiconductor fin and the first gate, between the second semiconductor fin and the second gate, and on sidewalls of the first dielectric layer.

5. The FinFET of claim 4 further comprising a fourth dielectric layer disposed between the first semiconductor fin and the third dielectric layer and between the second semiconductor fin and the third dielectric layer.

6. The FinFET of claim 4, wherein a material of the second dielectric layer and a material of the third dielectric layer are the same.

7. A fin field effect transistor (FinFET), comprising:
    a substrate comprising a first semiconductor fin, a second semiconductor fin and a trench between the first semiconductor fin and the second semiconductor fin, wherein the first semiconductor fin is extended in a first direction and has a height in a second direction perpendicular to the first direction;
    an insulator disposed in the trench;
    a first gate disposed on the first semiconductor fin;
    a second gate disposed on the second semiconductor fin;
    an opening disposed between the first gate and the second gate and over the insulator;
    a first dielectric layer disposed in the opening to electrically insulate the first gate and the second gate, wherein the first dielectric layer comprises a slit; and
    a second dielectric layer filled in the slit, wherein the slit has an aspect ratio larger than 10, wherein the first dielectric layer is disposed over and partially overlapped with the insulator in the second direction.

8. The FinFET of claim 7, wherein a top surface of the second dielectric layer is substantially coplanar with a top surface of the first dielectric layer.

9. The FinFET of claim 7, wherein the opening has a first width in a direction along which the first gate and the second gate extend, the slit has a second width in the direction, and a ratio of the first width to the second width is larger than 2.

10. The FinFET of claim 7, wherein a top critical dimension of the opening is substantially equal to a bottom critical dimension of the opening.

11. The FinFET of claim 7 further comprising a third dielectric layer disposed between the first semiconductor fin and the first gate, between the second semiconductor fin and the second gate, and on sidewalls of the first dielectric layer.

12. The FinFET of claim 11 further comprising a fourth dielectric layer disposed between the first semiconductor fin and the second dielectric layer and between the second semiconductor fin and the second dielectric layer.

13. The FinFET of claim 11, wherein a material of the second dielectric layer and a material of the third dielectric layer are the same.

* * * * *